(12) United States Patent
Hasegawa et al.

(10) Patent No.: US 9,923,464 B1
(45) Date of Patent: Mar. 20, 2018

(54) SWITCHING DEVICE AND POWER SUPPLY CIRCUIT

(71) Applicant: KABUSHIKI KAISHA TOSHIBA, Minato-ku, Tokyo (JP)

(72) Inventors: Kohei Hasegawa, Kanagawa (JP); Takenori Yasuzumi, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/446,955

(22) Filed: Mar. 1, 2017

(30) Foreign Application Priority Data

Sep. 9, 2016 (JP) .................................. 2016-176636

(51) Int. Cl.
| | |
|---|---|
| *G05F 1/00* | (2006.01) |
| *H02M 3/158* | (2006.01) |
| *H02M 3/156* | (2006.01) |
| *H02M 1/38* | (2007.01) |

(52) U.S. Cl.
CPC ........... *H02M 3/158* (2013.01); *H02M 3/156* (2013.01); *H02M 1/38* (2013.01)

(58) Field of Classification Search
CPC ......... H02M 1/38; H02M 3/156; H02M 3/158
See application file for complete search history.

(56) References Cited

U.S. PATENT DOCUMENTS

| | | | |
|---|---|---|---|
| 8,718,224 B2 | 5/2014 | Toyotaka | |
| 2008/0303560 A1* | 12/2008 | Higashi | H03K 17/0406 327/108 |
| 2014/0241015 A1* | 8/2014 | Barauna | H02M 3/156 363/37 |
| 2015/0131350 A1* | 5/2015 | Isomura | H02M 1/38 363/131 |
| 2015/0137871 A1* | 5/2015 | Takano | H03K 17/687 327/389 |
| 2015/0303806 A1* | 10/2015 | Madsen | H02M 7/5383 323/271 |
| 2016/0005725 A1 | 1/2016 | Ikeda | |
| 2016/0308444 A1 | 10/2016 | Hasegawa et al. | |
| 2016/0329808 A1* | 11/2016 | Han | H02M 1/08 |
| 2016/0352321 A1* | 12/2016 | Yamaguchi | H03K 17/162 |

FOREIGN PATENT DOCUMENTS

| | | |
|---|---|---|
| JP | 2010-035389 A | 2/2010 |
| JP | 2016-208080 A | 12/2016 |

* cited by examiner

*Primary Examiner* — Alex Torres-Rivera
(74) *Attorney, Agent, or Firm* — Foley & Lardner LLP

(57) ABSTRACT

A switching device includes first and switching elements connected in series, a capacitor connected to a gate of the first switching element, a diode having an anode connected between the capacitor and the gate of the first switching element and a cathode connected to a source of the first switching element. A capacitance of the capacitor is equal to or greater than a value calculated by a predetermined expression.

4 Claims, 4 Drawing Sheets

SWITCHING DEVICE AND POWER SUPPLY CIRCUIT

CROSS REFERENCE TO RELATED APPLICATION

This application claims the benefit of and priority to the Japanese Patent Application No. 2016-176636 filed on Sep. 9, 2016, the entire contents of which are incorporated herein by reference.

FIELD

Embodiments described herein relate generally to a switching device and a power supply circuit.

BACKGROUND

A power supply circuit which is used for an inverter can include a switching device in which a normally-on type switching element is connected to a normally-off type switching element in series. The switching device can include a bootstrap capacitor in some cases so that a common drive circuit drives both the normally-on type switching element and the normally-off type switching element. However, improvements in such switching devices remain desired.

SUMMARY

In some embodiments according to one aspect, a switching device including a first switching element of a normally-on type, a second switching element of a normally-off type connected to the first switching element in series, a capacitor connected to a gate of the first switching element, and a first diode having an anode and a cathode, the anode being connected between the capacitor and the gate of the first switching element, and the cathode being connected to a source of the first switching element. A capacitance Cb of the capacitor may be equal to or greater than a value calculated by the following expression:

$$Cb \geq \frac{Cd + Cgs1 + Cgd1(1 + G1)}{(1 + G2)Vin - Vgs1} Vgs1,$$

where
Cd is a capacitance of the first diode, Cgs1 is a capacitance between the gate of the first switching element and the source of the first switching element, Cgd1 is a capacitance between the gate of the first switching element and a drain of the first switching element, G1 is a voltage amplification degree of the first switching element, G2 is a voltage amplification degree of the second switching element, Vin is an input voltage input to the switching device, and Vgs1 is a voltage between the gate of the first switching element and the source of the first switching element.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

A switching device can include a bootstrap capacitor in some cases so that a common drive circuit drives both a normally-on type switching element and a normally-off type switching element. A capacitance of the bootstrap capacitor can be large so that the normally-on type switching element performs a stable switching operation. However, a power consumption of the switching device becomes large as the capacitance of the bootstrap capacitor becomes large.

On the other hand, a lower limit value of the capacitance of the bootstrap capacitor is not fully considered because the switching operation of the normally-on type switching element becomes unstable when the capacitance of the bootstrap capacitor is set to be small.

In some embodiments of the present disclosure, a switching device is capable of switching stably and suppressing a power consumption, and a power supply circuit including the switching device.

According to some embodiments, a switching device may include a first normally-on type switching element, a second normally-off type switching element connected to the first switching element in series, a capacitor connected to a gate of the first switching element, and a first diode in which an anode is connected between the capacitor and the gate of the first switching element, and a cathode is connected to a source of the first switching element. In some embodiments, a capacitance Cb of the capacitor is equal to or greater than a value calculated by the following expression.

$$Cb \geq \frac{Cd + Cgs1 + Cgd1(1 + G1)}{(1 + G2)Vin - Vgs1} Vgs1,$$

where
Cd: a capacitance of the first diode,
Cgs1: a capacitance between the gate of the first switching element and the source of the first switching element,
Cgd1: a capacitance between the gate of the first switching element and a drain of the first switching element,
G1: a voltage amplification degree of the first switching element,
G2: a voltage amplification degree of the second switching element,
Vin: an input voltage input to the switching device, and
Vgs1: a voltage between the gate of the first switching element and the source of the first switching element.

Embodiments of the present disclosure will described hereinafter with reference to an accompanying drawings. The embodiments are not intended to limit the scope of the disclosure.

Figure 1:
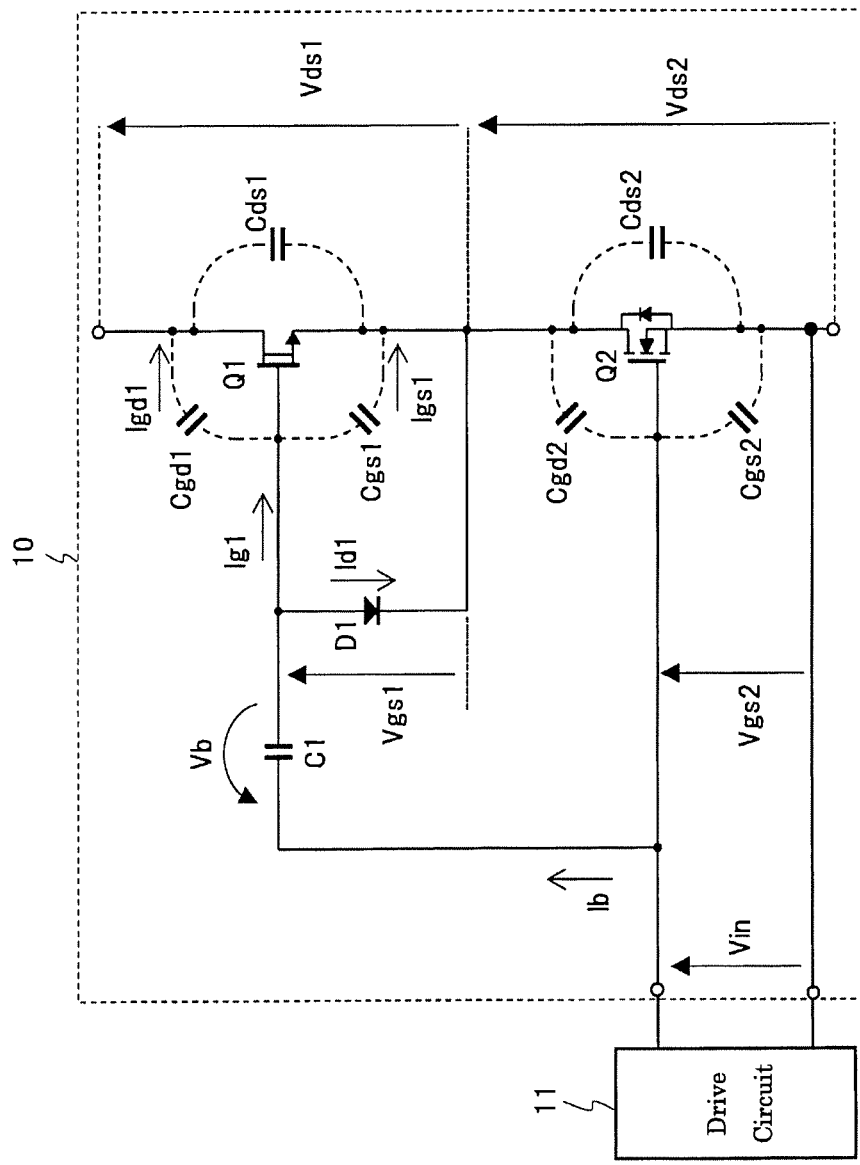
FIG. 1 is a circuit diagram showing a schematic configuration of a switching device according to some embodiments.

FIG. 1 is a circuit diagram showing a schematic configuration of a switching device according to some embodiments. A switching device 10 depicted in FIG. 1 is driven by a drive circuit 11. In some embodiments, the switching device 10 and the drive circuit 11 are provided in a power supply circuit such as an inverter.

In some embodiments, the switching device 10 includes a switching element Q1, a switching element Q2, a capacitor C1, and a diode D1. The switching element Q1 and Q2 correspond to a first and a second switching elements respectively. The diode D1 corresponds to a first diode.

In some embodiments, the switching element Q1 may include a normally-on type switching element. In some embodiments, the switching element Q1 may include a HEMT (High Electron Mobility Transistor) made of gallium nitride (GaN), for example. In some embodiments, a gate of the switching element Q1 is connected to the drive circuit 11 though the capacitor C1.

In some embodiments, the switching element Q1 has a capacitance Cgd1 between the gate and a drain thereof, a capacitance Cgs1 between the gate and a source thereof, and a capacitance Cds1 between the drain and the source thereof. In some embodiments, the capacitance Cgd1, Cgs1, and Cds1 are respectively charged when the switching element Q1 is made into on-state by the drive circuit 11.

In some embodiments, the switching element Q2 includes a normally-off type switching element. In some embodiments, the switching element Q2 includes a n-channel MOSFET (Metal Oxide Semiconductor Field Effect Transistor) for example. In some embodiments, the switching element Q2 is connected to the switching element Q1 in series, for example, a drain of the switching element Q2 is connected to the source of the switching element Q1. In some embodiments, a gate of the switching element Q2 is connected to the drive circuit 11 without passing through the capacitor C1.

In some embodiments, the switching element Q2 have a capacitance Cgd2 between the gate and the drain thereof, a capacitance Cgs2 between the gate and a source thereof, and a capacitance Cds2 between the drain and the source thereof. In some embodiments, the capacitance Cgd2, Cgs2, and Cds2 are respectively charged when the switching element Q2 is made into an on-state by the drive circuit 11.

In some embodiments, the switching element Q2 switches according to the same timing as the switching element Q1 by the drive circuit 11 such that both switching elements transition to the on-state at the same time and both switching elements transition to an off-state at the same time.

In some embodiments, the capacitor C1 is connected between the gate of the switching element Q1 and the drive circuit 11. In some embodiments, the capacitor C1 is used as a bootstrap capacitor for performing a switching operation of the switching element Q1 by the common drive circuit 11 which is commonly connected to the switching elements Q1 and Q2.

In some embodiments, the diode D1 is connected in a forward direction between the gate and the source of the switching element Q1, for example, an anode of the diode D1 is connected between the gate of the switching element Q1 and the capacitor C1, and a cathode of the diode D1 is connected to the source of the switching element Q1. The diode D1 has a capacitance Cd.

In some embodiments, in the switching device 10 composed as the above description, a power consumption becomes large as a capacitance of the capacitor C1 becomes large, thereby, increasing a load of the drive circuit 11.

On the other hand, an electric charge which is charged in the capacitor C1 is decreased as the capacitance of the capacitor C1 becomes small. As the result, a switching operation of the switching element Q1 may easily become unstable due to insufficient charge of the capacitance Cgd1, Cgs1, and Cds1 of the switching element Q1

In some embodiments, an expression for a calculation of a minimum capacitance Cb of the capacitor C1 for the switching operation of the switching element Q1 is offered under a consideration of the capacitances of the switching element Q1 and Q2 and the capacitance of the diode D1. Hereinafter, a calculation method of the capacitance Cb of the capacitor C1 will be described.

In some embodiments, the input voltage Vin which is input to the switching device 10 from the drive circuit 11 can be calculated by the following expression (1). The input voltage Vin is a voltage supplied to the gate of the switching element Q1 and the gate of the switching element Q2.

$$Vin = Vds2 + Vgs1 + Vb \tag{1}$$

In the expression (1), the voltage Vds2 is a voltage between the drain and the source of the switching element Q2 (while Vds1 is a voltage between the drain and the source of the switching element Q1). The Vgs1 is a voltage between the gate and the source of the switching element Q1. A voltage Vb is a voltage of the capacitor C1.

In some embodiments, the following expression (2) which indicates a relation between the current Ib and the voltage Vb is established by using the capacitance Cb.

$$Vb = \frac{1}{Cb}\int Ibdt \tag{2}$$

In some embodiments, the current Ib is expressed by the following expression (3) for which a gate current Ig1 of the switching element Q1 is used. In some embodiments, the gate current Ig1 is divided into a current Igd1 flowing between the gate and the drain of the switching element Q1 and a current Igs1 flowing between the gate and the source of the switching element Q1.

$$Ib = Id1 + Ig1 = Id1 + Igd1 + Igs1 \tag{3}$$

In some embodiments, the following expression (4) is established by substituting the expression (3) into the expression (2).

$$Vb = \frac{1}{Cb}\int (Id1 + Igd1 + Igs1)dt \tag{4}$$

In some embodiments, the currents Id1, Igd1, and Igs1 are respectively expressed by following expressions (5), (6), and (7).

$$Id = Cd\frac{dVgs1}{dt} \tag{5}$$

$$Igd1 = Cgd1(1+G1)\frac{dVgs1}{dt} \tag{6}$$

$$Igs1 = Cgs1\frac{dVgs1}{dt} \tag{7}$$

In the expression (6), G1 is the degree of the voltage amplification of the switching element Q1 and a mirror effect is considered. In some embodiments, G1 is defined by the following expression (8).

$$G1 = -\frac{Vds1}{Vgs1} \quad (8)$$

The expression (5), (6), and (7) are substituted into the expression (4) to establish the following expression (9).

$$Vb = \frac{1}{Cb}\{Cd + Cgs1 + Cgd1(1+G1)\}Vgs1 \quad (9)$$

In some embodiments, the voltage Vds2 indicated in the expression (1) is expressed by the following expression (10) for which the voltage amplification degree G2 is used.

$$Vds2 = -G2\ Vgs2 \quad (10)$$

In some embodiments, a relation of Vds2=Vin is established when a voltage drop is not considered herein.

The expression (9) and (10) are substituted into the expression (1) to establish the following expression (11).

$$Cb = \frac{Cd + Cgs1 + Cgd1(1+G1)}{(1+G2)Vin - Vgs1}Vgs1 \quad (11)$$

In some embodiments, a lower limit value of the capacitance of the capacitor C1 can be set to be equal to or greater than the value of the capacitance Cb calculated by the expression (11) when the normally-off type switching element Q2 performs a switching operation at the same timing as the normally-on type switching element Q1 (or when the normally-off type switching element Q2 performs a switching operation according to the same timing as the normally-on type switching element Q1). Thereby, in some embodiments, the capacitance Cgd1, Cgs1, and Cds1 of the switching element Q1 can be charged with the electric charge of the capacitor C1 and the switching element Q1 can perform the stable switching operation. In some embodiments, the capacitance Cb of the capacitor C1 can be suppressed to a minimum value to suppress the power consumption of the switching device 10. In some embodiments, the voltage Vgs1 becomes larger than the voltage Vin when the denominator ((1+G2) Vin−Vgs1) is positive in the expression (11). In this case, in some embodiments, the switching element Q1 can be driven by the rated voltage Vgs2 of the switching element Q2 when an allowable voltage of the voltage Vgs2 of the switching element Q2 (e.g., the voltage Vin) is smaller than a drive voltage of the switching element Q1.

Figure 2:
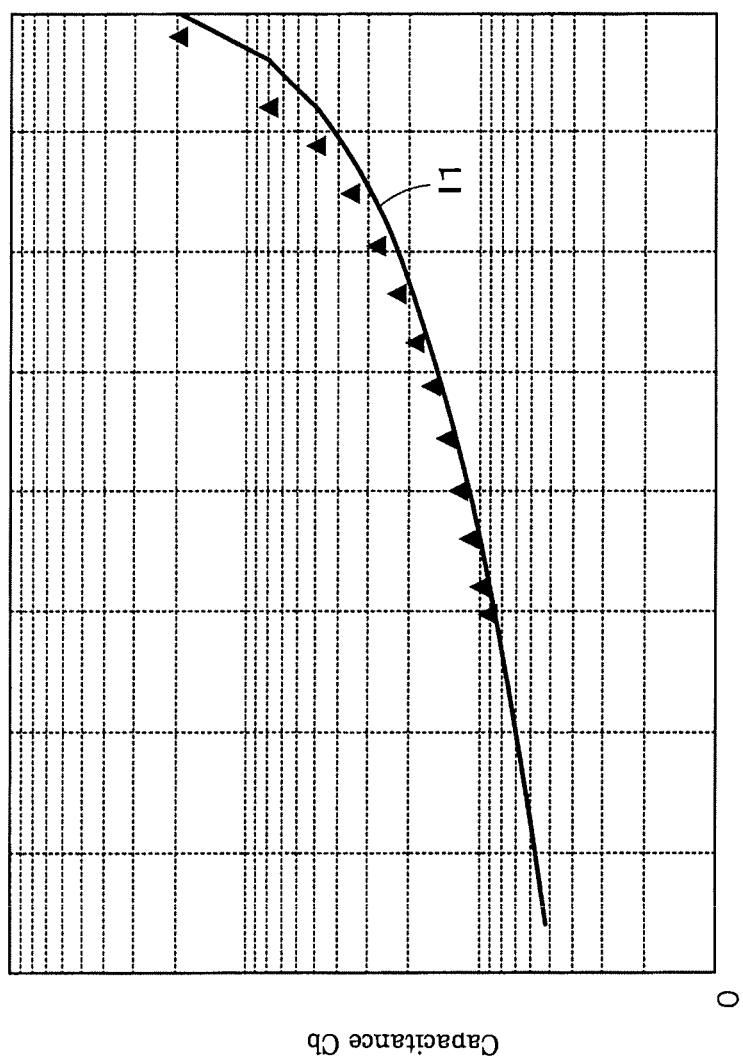
FIG. 2 is a graph showing a relation between a variation width of a voltage between a gate and a source of a switching element Q1 and a capacitance Cb of a capacitor C1 according to some embodiments.

FIG. 2 is a graph showing a relation between (1) a variation width of a voltage between the gate and the source of the switching element Q1 and (2) the capacitance Cb of the capacitor C1. A horizontal axis in FIG. 2 indicates the variation width of the voltage between the gate and the source of the switching element Q1. The variation width of the voltage is an amplitude value of a pulse (e.g., Peak to Peak value) applied between the gate and the source of the switching element Q1. A vertical axis indicates the capacitance Cb of the capacitor C1 represented by using logarithm.

A line I1 in FIG. 2 indicates a relation between the above variation width of the voltage and the capacitance Cb drawn from the expression (11). Triangles of plots indicate values obtained from an analytical result of a circuit simulation. In the circuit simulation, a circuit which the switching element Q1 and Q2 are driven by a inductive load (or L load) is used.

According to FIG. 2, the capacitance values calculated by the expression (11) almost correspond to the analytical result, therefore, it can be said that the expression (11) has an effectiveness.

As described above, in some embodiments, the minimum value of the capacitance Cb of the capacitor C1 for switching operation of the switching element Q1 can be obtained. Thereby, in some embodiments, the switching operation of the switching element Q1 can be stably performed and the power consumption of the switching device 10 is suppressed.

Figure 3:
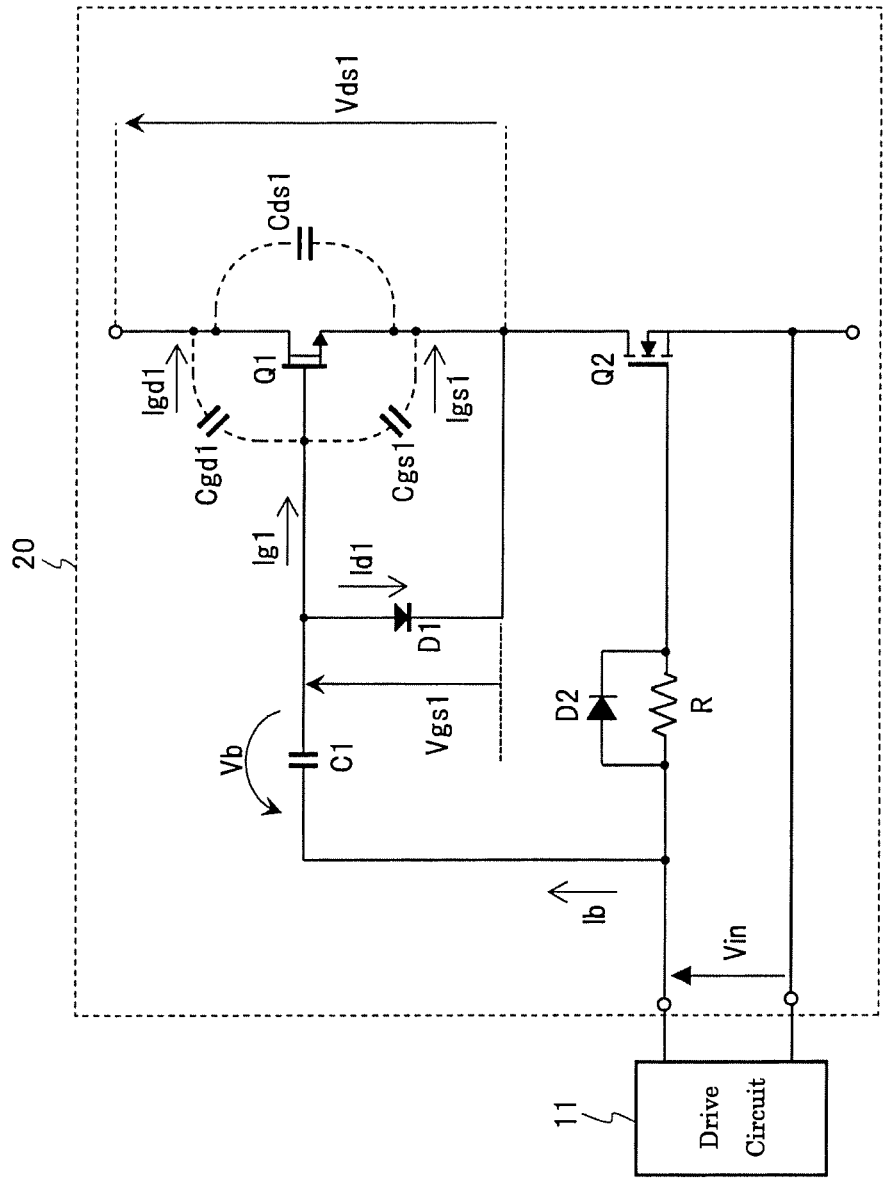
FIG. 3 is a circuit diagram showing a schematic configuration of a switching device according to some embodiments.

FIG. 3 is a circuit diagram showing a schematic configuration of a switching device according to some embodiments.

The same components as the switching device 10 according to the embodiment illustrated in FIG. 1 are represented by the same symbols, a detail description of which may be omitted.

As shown in FIG. 3, in some embodiments, a switching device 20 further includes a resistor element R, a diode D2 in addition to the components of the switching device 10. The diode D2 corresponds to a second diode.

In some embodiments, the resistor element R is connected to the gate of the switching element Q2. In some embodiments, the diode D2 is connected to the resistor element R in parallel. In some embodiments, an anode of the diode D2 is connected to the drive circuit 11 and a cathode of the diode D2 is connected to the gate of the switching element Q2.

In some embodiments, in the switching device 20, the switching element Q2 is applied with a voltage equal to or greater than a threshold voltage which the switching element Q2 becomes the on-state by the diodeD2. Therefore, in some embodiments, the switching element Q2 is always-on during the switching operation of the switching element Q1.

A calculation method of the capacitance Cb of the capacitor C1 will described according to some embodiments. In some embodiments, in the expression (1), Vds2=0 can be considered because the switching element Q2 is always-on.

Therefore, G=0 is established in the expression (10). A relation expressed by a expression (12) is established when G=0 is substituted to the expression (11).

$$Cb = \frac{Cd + Cgs1 + Cgd1(1+G1)}{Vin - Vgs1}Vgs1 \quad (12)$$

Also, Vin−Vgs1=Vb is established when Vds2=0 is substituted to the expression (11). A relation expressed by an expression (13) is established when Vin−Vgs1=Vb is substituted to the expression (12).

$$Cb = \{Cd + Cgs1 + Cgd1(1+G1)\}\frac{Vgs1}{Vb} \quad (13)$$

In some embodiments, a lower limit value of the capacitance of the capacitor C1 can be set to be equal to or greater than the value of the capacitance Cb calculated by the expression (13) when the normally-on type switching element Q1 performs the switching operation and the normally-off type switching element Q2 is always-on. Thereby, in some embodiments, the switching element Q1 can performs the stable switching operation and a power consumption of the switching device 20 can be suppressed.

Figure 4:
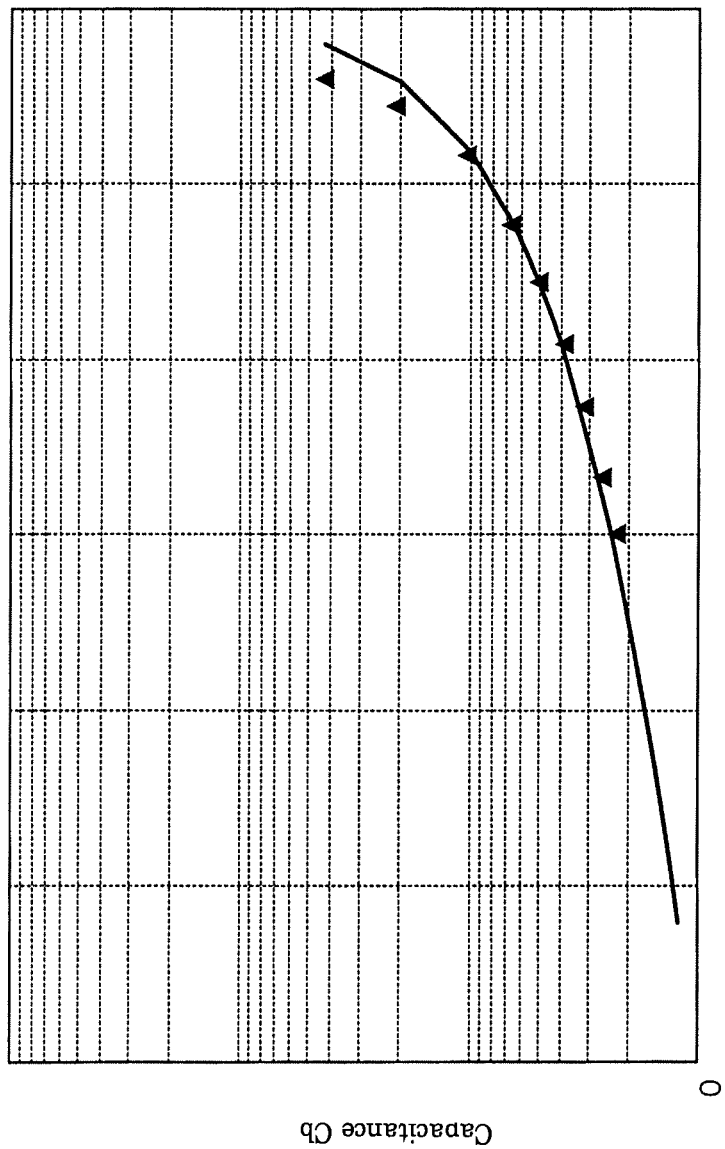
FIG. 4 is a graph showing a relation between a variation width of a voltage between the gate and the source of the switching element Q1 and the capacitance Cb of the capacitor C1 according to some embodiments.

FIG. 4 is a graph showing a relation between (1) a variation width of a voltage between the gate and the source of the switching element Q1 and (2) the capacitance Cb of the capacitor C1 according to some embodiments. A horizontal axis in FIG. 4 indicates the variation width of the voltage between the gate and the source of the switching element Q1. A vertical axis indicates the capacitance Cb of the capacitor C1 represented by using logarithm.

A line 12 in FIG. 4 indicates a relation between the above variation width of the voltage and the capacitance Cb drawn from the expression (13). Triangles of plots indicate values obtained from an analytical result of a circuit simulation. In the circuit simulation, a circuit in which the switching element Q1 are driven by a inductive load (or L load) is used.

According to FIG. 4, the capacitance values calculated by the expression (13) almost correspond to the analytical result, therefore, it can be said that the expression (13) has an effectiveness.

As described above, in some embodiments, the minimum value of the capacitance Cb of the capacitor C1 for switching operation of the switching element Q1 can be obtained. Thereby, in some embodiments, under a condition that the switching element Q2 is always-on, the switching operation of the switching element Q1 can be stably performed and the power consumption of the switching device 10 can be suppressed.

While certain embodiments have been described, these embodiments have been presented by way of example only, and are not intended to limit the scope of the disclosure. Indeed, the methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A switching device comprising:
a first switching element of a normally-on type;
a second switching element of a normally-off type connected to the first switching element in series;
a capacitor connected to a gate of the first switching element; and
a first diode having an anode and a cathode, the anode being connected between the capacitor and the gate of the first switching element, and the cathode being connected to a source of the first switching element,
wherein a capacitance (Cb) of the capacitor is equal to or greater than a value calculated by the following expression:

$$Cb \geq \frac{Cd + Cgs1 + Cgd1(1 + G1)}{(1 + G2)Vin - Vgs1} Vgs1,$$

where
Cd is a capacitance of the first diode,
Cgs1 is a capacitance between the gate of the first switching element and the source of the first switching element,
Cgd1 is a capacitance between the gate of the first switching element and a drain of the first switching element,
G1 is a voltage amplification degree of the first switching element,
G2 is a voltage amplification degree of the second switching element,
Vin is an input voltage input to the switching device,
Vgs1 is a voltage between the gate of the first switching element and the source of the first switching element.

2. The switching device according to claim 1, wherein the second switching element is configured to switch at a same timing as the first switching element.

3. The switching device according to claim 1, wherein the second switching element switches to an on-state when the first switching element switches and the capacitance (Cb) is equal to or greater than a value calculated by the following expression:

$$Cb \geq \{Cd + Cgs1 + Cgd1(1 + G1)\}\frac{Vgs1}{Vb},$$

where
Vb is a voltage of the capacitor.

4. A power supply circuit comprising:
the switching device according to claim 1; and
a drive circuit configured to drive the switching device.

* * * * *